(12) United States Patent
Franklin et al.

(10) Patent No.: US 12,255,108 B2
(45) Date of Patent: Mar. 18, 2025

(54) NANOWIRE-BASED INTERCONNECTS FOR SUB-MILLIMETER WAVE INTEGRATED CIRCUIT APPLICATIONS

(71) Applicants: Regents of the University of Minnesota, Minneapolis, MN (US); Board of Regents, The University of Texas System, Austin, TX (US)

(72) Inventors: Rhonda Franklin, Minneapolis, MN (US); Aditya Dave, Minneapolis, MN (US); Yali Zhang, Minneapolis, MN (US); Bethanie Joyce Hills Stadler, Minneapolis, MN (US); Allison Harpel, Minneapolis, MN (US); Rashaunda Henderson, Austin, TX (US); Nikita Mahjabeen, Austin, TX (US)

(73) Assignees: Regents of the University of Minnesota, Minneapolis, MN (US); The University of Texas at Dallas, Richardson, TX (US)

( * ) Notice: Subject to any disclaimer, the term of this patent is extended or adjusted under 35 U.S.C. 154(b) by 329 days.

(21) Appl. No.: 17/843,933

(22) Filed: Jun. 17, 2022

(65) Prior Publication Data

US 2023/0411221 A1 Dec. 21, 2023

(51) Int. Cl.
*G01R 31/28* (2006.01)
*H01L 21/8238* (2006.01)
(Continued)

(52) U.S. Cl.
CPC .. *H01L 21/823871* (2013.01); *G01R 31/2887* (2013.01); *H01L 23/66* (2013.01);
(Continued)

(58) Field of Classification Search
CPC ............ H01L 21/823871; H01L 23/66; H01L 29/0669; H01L 2221/1078; G01R 31/2887; H01P 3/003; H01P 11/003; B82Y 20/00
See application file for complete search history.

(56) References Cited

U.S. PATENT DOCUMENTS

| 2015/0070110 A1* | 3/2015 | Ferrari ................... H01P 3/082 333/238 |
| 2022/0393328 A1 | 12/2022 | Franklin et al. |
| 2022/0393329 A1 | 12/2022 | Stadler et al. |

OTHER PUBLICATIONS

Zhang et al., Study of Nanowire-Based Integrated via Technology for CMOS Application in Millimeter-Wave Frequencies, IEEE Microwave and Wireless Components Letters, vol. 31, No. 6, pp. 693-696, Jun. 7, 2021 (Year: 2021).*

(Continued)

*Primary Examiner* — Daniel R Miller
(74) *Attorney, Agent, or Firm* — Fish & Richardson P.C.

(57) ABSTRACT

A device includes a substrate and at least one electrically conducting portion supported by the substrate, the at least one electrically conducting portion including a signal line and a ground plane electrically isolated from the signal line. The electrically conducting portion includes a layer of a first electrically conducting material and a layer of a metal oxide material including anodic aluminum oxide (AAO) and one or more nanowires (NW) of a second electrically conducting material each formed within a corresponding pore extending through the AAO from a first side of the layer to a second side of the layer of the metal oxide material opposite the first side.

20 Claims, 10 Drawing Sheets (51) Int. Cl.
    *H01L 23/66*     (2006.01)
    *H01L 29/06*     (2006.01)
    *H01P 11/00*     (2006.01)

(52) U.S. Cl.
    CPC ........ *H01L 29/0669* (2013.01); *H01P 11/003* (2013.01); *H01L 2221/1078* (2013.01)

(56) References Cited

OTHER PUBLICATIONS

Júlio Mota Pinheiro, Development of passive circuits in nanowire-membrane technology in millimeter wave frequencies : application to functionalized interposer. Micro and nanotechnologies/Microelectronics. Université Grenoble Alpes [2020-..]; Universidade de São Paulo (Brésil), 2020 (Year: 2020).*

M. V. Pelegrini et al., "Interposer based on metallic-nanowire-membrane (MnM) for mm-wave applications," 2016 46th European Microwave Conference (EuMC), London, UK, 2016, pp. 1461-1464 (Year: 2016).*

Yeh et al., Advances in Silicon Based Millimeter-Wave Monolithic Integrated Circuits, Micromachines 2014, 5(4), 1373-1415 (Year: 2014).*

Bleiker et al., "High-Aspect-Ratio Through Silicon Vias for High-Frequency Application Fabricated by Magnetic Assembly of Gold-Coated Nickel Wires," IEEE Trans. Compon. Packag. Manuf. Technology, Jan. 2015, 5(1):21-27.

Chan et al., "Porous Anodic Aluminum Oxide Interposer Process Integration, Fabrication, Characterization, and Evaluation," ECS J. Solid State Sci. Technol., Jan. 2019, 8(1):p. 18-p. 23.

Collier, "Coupling Between Coplanar Waveguides and Substrate Modes," 1999 29th European Microwave Conference, Oct. 1999, 382-385.

Dave et al., "180 GHz Low-loss Copper Nanowire CPW Interconnects," 2022 IEEE/MTT-S International Microwave Symposium—IMS 2022, Jun. 2022, 1034-1036.

Macrotrends.com [online], "Copper Prices—45 Year Historical Chart," retrieved on Mar. 8, 2023, retrieved from URL<https://www.macrotrends.net/1476/copper-prices-historical-chart-data>, 4 pages.

Margomenos et al., "Fabrication and Accelerated Hermeticity Testing of an On-Wafer Package for RF MEMS," IEEE Trans. Microw. Theory Techniques, Jun. 2004, 52(6):1626-1636.

Pinheiro et al., "110-GHz Through-Substrate-Via Transition Based on Copper Nanowires in Alumina Membrane," IEEE Transactions on Microwave Theory and Techniques, Feb. 2018, 66(2):784-790.

Pinheiro et al., "Nanowire-based Through Substrate Via for Millimeter-Wave Frequencies," Proceedings of the 2016 IEEE MTT-S International Microwave Symposium (IMS), San Francisco, CA, USA, May 22-27, 2016, 4 pages.

Um et al., "Fabrication of Long-Range Ordered Aluminum Oxide and Fe/Au Multilayered Nanowires for 3-D Magnetic Memory," IEEE Transactions on Magnetics, Feb. 2020, 56(2):6701006, 6 pages.

Zhang et al., "Study of Nanowire-Based Integrated via Technology for CMOS Application in Millimeter-Wave Frequencies," IEEE Microwave and Wireless Components Letters, Jun. 2021, 31(6):693-696.

* cited by examiner

NANOWIRE-BASED INTERCONNECTS FOR SUB-MILLIMETER WAVE INTEGRATED CIRCUIT APPLICATIONS

TECHNICAL FIELD

This disclosure relates to nanowire (NW) based waveguides for integrated circuits and other nanotechnology applications, including NW waveguide interconnects suitable for high-frequency applications.

BACKGROUND

Modern communication technologies increasingly involve use of highly integrated systems of computing, imaging, sensing, and communicating technologies to provide real time sensing, control, and connectivity. These higher levels of integration also increasingly demand smaller lightweight form factors and electronic designs that consume very low power to improve battery life and lifetimes. As the number of devices and information size continue to increase, communication technology that operates as high as the submillimeter regime is needed.

Copper is an important material in low-cost integrated circuit electronics and growth of communication technologies has increased demand for this resource. For integrated circuits, approaches that can reduce the use of copper use and meet the performance demands of high-speed digital and analog electronics operating in a broad range of frequencies (i.e., LF to submillimeter wave) are desired.

SUMMARY

This disclosure features interconnects that utilize nanowires formed in anodic aluminum oxide. For example, designs for transmission lines suitable for sub-millimeter wave applications are disclosed. Such architectures, when implemented using copper, can utilize significantly less copper than transmission lines formed from bulk copper. Moreover, such architectures can exhibit low losses for frequencies ranging from 10 MHz to 180 GHz, for example. Examples of coplanar waveguides are described, but other transmission line architectures using nanowires are also possible.

Various aspects of the disclosure are summarized as follows.

In general, in a first aspect, the disclosure features a device that includes a substrate and at least one electrically conducting portion supported by the substrate, the at least one electrically conducting portion including a signal line and a ground plane electrically isolated from the signal line. The electrically conducting portion includes a layer of a first electrically conducting material and a layer of a metal oxide material including anodic aluminum oxide (AAO) and one or more nanowires (NW) of a second electrically conducting material each formed within a corresponding pore extending through the AAO from a first side of the layer to a second side of the layer of the metal oxide material opposite the first side.

Implementations of the device can include one or more of the following features and/or features of other aspects. For example, the signal line can include the layer of the metal oxide material. The ground plane can include the layer of the metal oxide material.

In some implementations, both the signal line and the ground plane can include the layer of the metal oxide material.

The first electrically conducting material can include a metal. The metal of the first electrically conducting material can be selected from the group of Cu, Al, Au, and Ag. The second electrically conducting material can include a metal. The metal of the second electrically conducting material can be selected from the group of Cu, Al, Au, and Ag. The first and second electrically conducting materials can be the same. For example, the first and second electrically conducting materials can be Cu.

In some examples, the substrate can be a silicon substrate.

The layer of the first electrically conducting material can have a thickness of 5 μm or less. For example, the layer of the first electrically conducting material can have a thickness in a range from 0.5 μm to 2 μm.

The layer of metal oxide material can have a thickness of 5 μm or less. For example, the layer of metal oxide material can have a thickness in a range from 0.5 μm to 2 μm.

The signal line can have a width in a range from 1 μm to 200 μm.

The ground plane can have a width in a range from 5 μm to 1,000 μm.

The nanowires can constitute 50% or less (e.g., 40% or less, 30% or less, 20% or less) of a volume of the layer of metal oxide material.

In some examples, the device can be a waveguide having a loss per unit length in a range from 0.3 dB/mm to 0.6 dB/mm for electrical signals spanning a frequency range of 50 GHz to 180 GHz.

In certain examples, the device can be a waveguide having an insertion loss in a range from −1.0 dB to −1.8 dB for electrical signals spanning a frequency range of 50 GHz to 180 GHz.

The electrically conducting portion can include a layer of a third electrically conducting material, wherein the layer of the metal oxide is arranged between the layer of the first electrically conducting material and the layer of the third electrically conducting material. The first and third electrically conducting materials can be a metal, e.g., Cu.

The device can include a coplanar waveguide or a microstrip waveguide.

In general, in another aspect, the disclosure features a method that includes contacting a probe to opposing ends of the signal line of the device and measuring an insertion loss for the signal line for an electrical signal having a frequency in a range from 140 GHz to 180 GHz.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
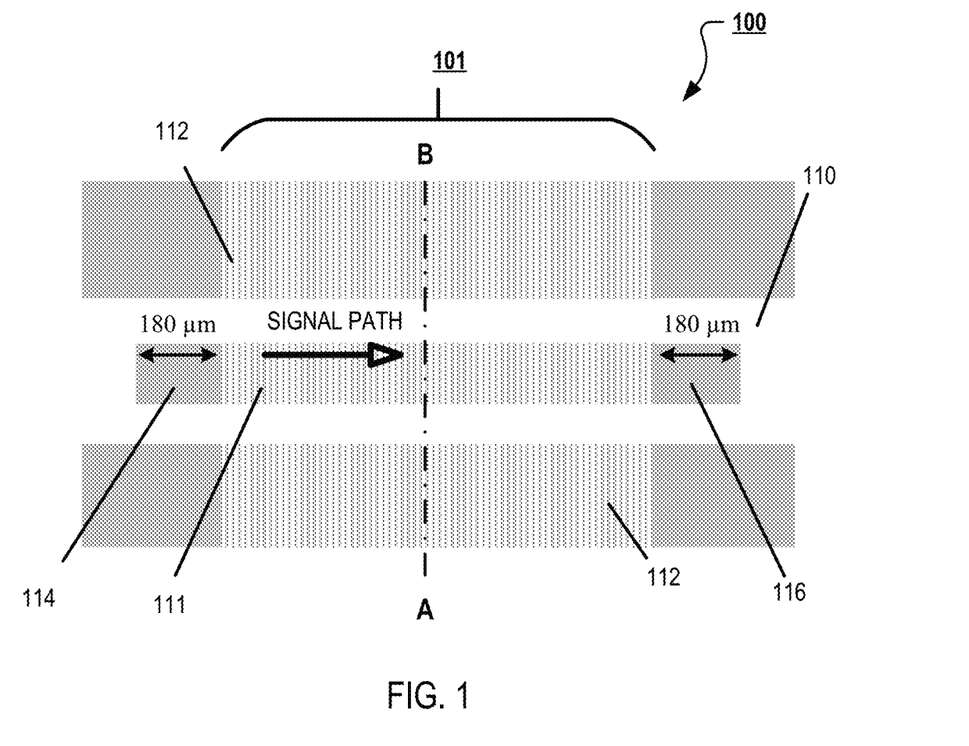
FIG. 1 is a plan view of a one-unit CPW circuit that can be used to characterize a CPW.
Figure 2A:
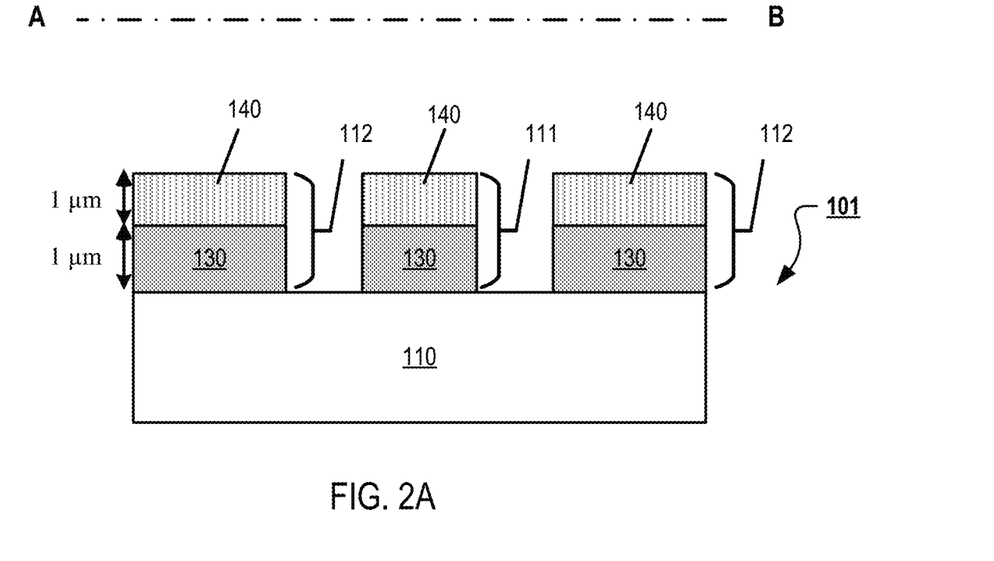
FIG. 2A-2D are cross-sectional views of example nanowire CPWs.

Referring to FIG. 1, an example one-unit coplanar waveguide (CPW) circuit 100 includes an example nanowire (NW) CPW 101. The circuit 100 is an example of a test structure that can characterize performance metrics of CPW devices, such as their insertion loss, return loss, loss per unit length, phase delay, etc. For clarity, the NW CPW 101 is bounded by a parenthesis to indicate feature boundaries of the NW CPW 101. A cross-section of the NW CPW 101, corresponding to an A-B dash-dot line, is depicted in FIG. 2A. Reference will be made to both FIG. 1 and FIG. 2A to clearly describe various components of the circuit 100 and NW CPW 101. Although the circuit 100 includes a particular implementation of a NW CPW, analogous test structures can used for different CPW designs, such as those depicted in FIGS. 2B-2E, and the architectures disclosed can be applied to transmission lines more generally (e.g., other CPW designs, microstrips).

FIG. 1 and FIG. 2A show dimensions of example implementations of the circuit 100 and NW CPW 101. Note that drawings are not to scale and these dimensions should not be considered limitations of the circuit 100 and/or NW CPW 101. Generally, NW CPWs can be realized in various sizes and dimensions depending on the desired application. For example, dimensions of the NW CPW 101 can be tuned to coincide with single mode operation in different frequency ranges.

Generally, NW CPW devices, such as the NW CPW 101, can be utilized as interconnects for integrated circuit (IC) applications to transmit high-frequency electrical signals (e.g., microwave and millimeter wave frequencies) between various components of an IC. Specifically, the NW CPW 101 can transmit signals with limited loss while utilizing less resources, i.e., less conducting material, as standard pure metal CPWs. As will be elaborated below, the NW CPW 101 uses nanowire technology to reduce a total volume of conducting material. For example, in copper based devices, the NW CPW 101 can use as little as 12% a total volume of copper as standard CPWs while achieving superior loss performance.

Components of the one-unit NW CPW circuit 100 are supported by a substrate 110, such as a silicon (Si) wafer (e.g., high resistivity Si wafer). In general, the substrate 110 can be any suitable dielectric material but Si is usually implemented due to its ubiquity in ICs. A ground plane 112 serves as a reference potential for the circuit 100 and is electrically isolated from a signal line 111. The signal line 111 enables transmission of electronic signals through the CPW. The signal line 111 is electrically connected to an input port 114 at one end and an output port 116 at an opposing end. The input and output ports 114 and 116 can be coupled to external devices, such as a signal generator, electronic control module, network analyzer, etc., to characterize the NW CPW 101. Here, the ports 114 and 116 have a length of 180 μm which can be altered to accommodate various testing probes.

The ground plane 112, signal line 111 and ports 114/116 are composed of a layer of electrically conducting material 130, such as a suitable metal (e.g., copper (Cu), aluminum (Al), silver (Ag), gold (Au), nickel (Ni), etc.) or some composition of metals. Dark gray regions of FIG. 1 and FIG. 2A represent conducting material. In this case, the layer of conducting material 130 has a uniform thickness of 1 μm across the ground plane 112 and signal line 111. However, different thicknesses can be implemented and the layer of conducting material 130 need not be uniform across all components. Alternatively or in addition, the ground plane 112 and signal line 111 may be composed of layers of different conducting materials.

Figure 7A:
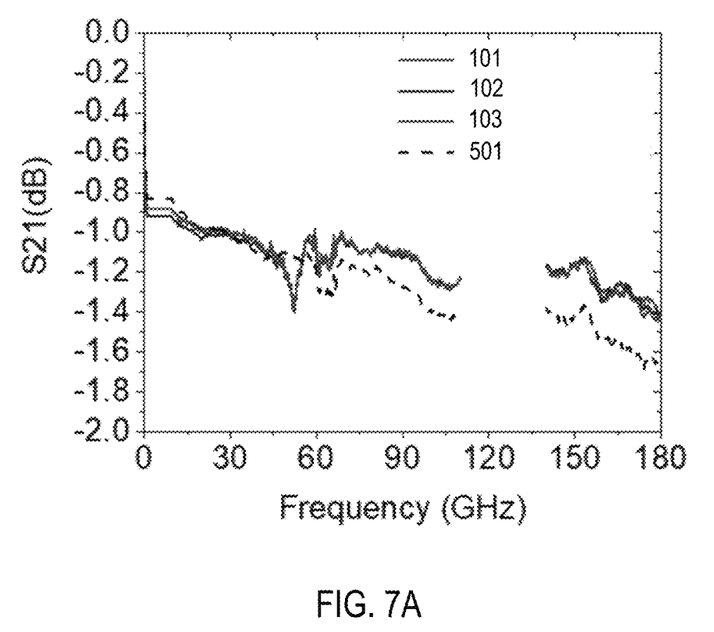
FIG. 7A is a plot showing insertion loss performance of example narrow profile nanowire CPWs compared to a standard narrow profile CPW across a frequency range of 10 MHz to 180 GHz.
Figure 7B:
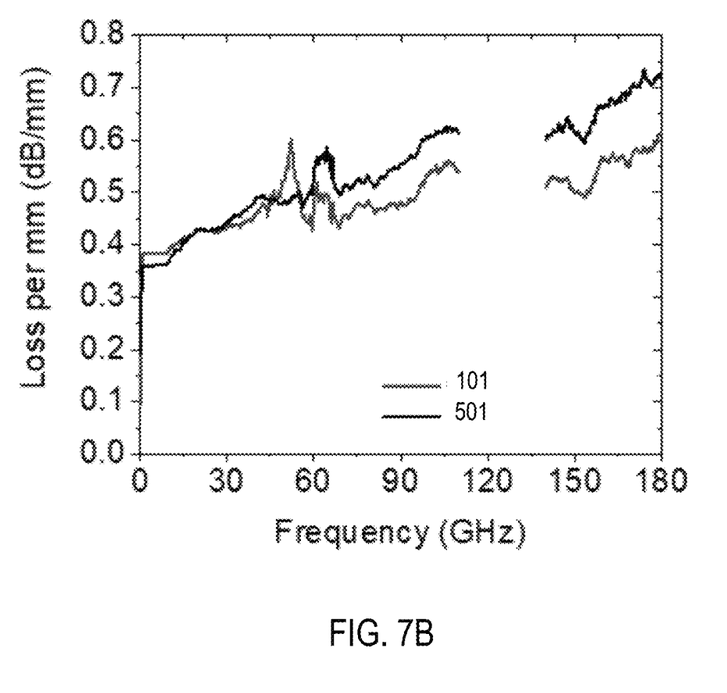
FIG. 7B is a plot showing computed loss per unit length of an example narrow profile nanowire CPW circuit compared to a standard narrow profile CPW across a frequency range of 10 MHz to 180 GHz.

In general, an advantage of NW CPWs is that less conducting material overall is required to form IC interconnects while simultaneously improving performance. Considerable savings can be realized in the ground plane 112 which typically consumes a majority of the conducting material. For example, standard CPWs often use a 1 μm thick conducting layer 130 but suffer from poor loss performance when operating in a 50 GHz to 180 GHz frequency band (and higher). To compensate, a CPW with a thicker conducting layer 130 of about 3 μm can be used in this band. However, despite tripling the conducting material, the CPW shows marginal improvement and still has a higher insertion loss compared to NW CPWs, as seen in FIG. 7A and FIG. 7B.

Figure 2B:
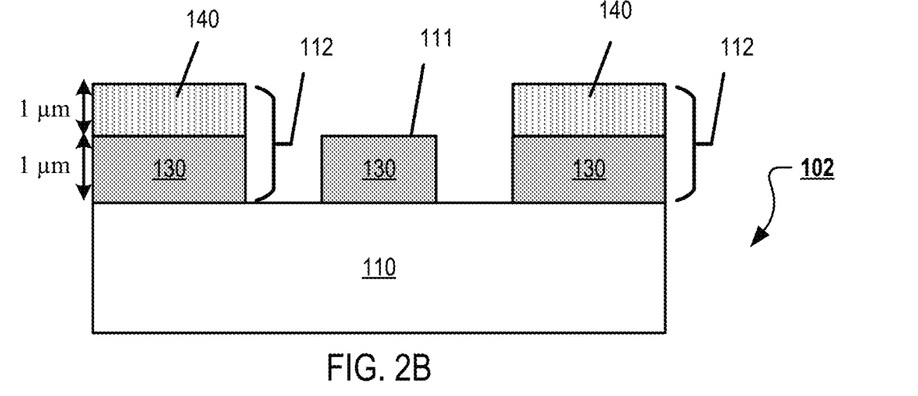
Figure 2C:
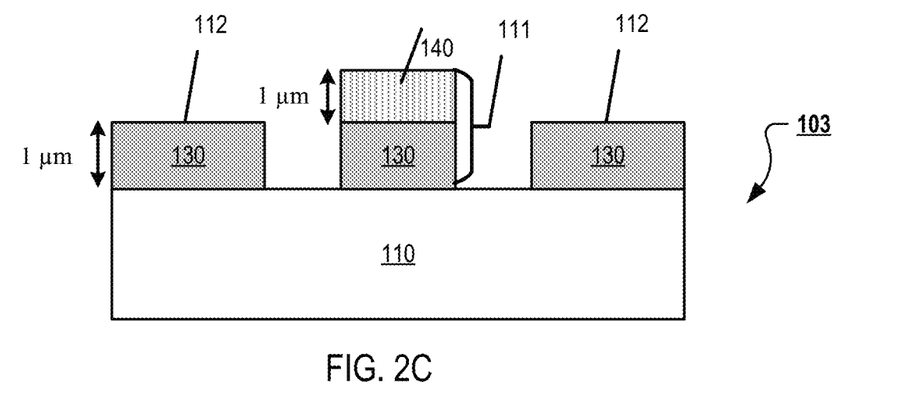

To achieve these properties, the ground plane 112 and signal line 111 are, additionally, composed of a nanopore layer 140 that facilitates nanowire technology. The nanopore layer 140 is composed of anodic aluminum oxide (AAO) that hosts multiple NWs arranged normal to a plane of the circuit 100. In other words, the NWs are perpendicular to a signal path of the NW CPW 101. In this case, the nanopore layer 140 has a uniform thickness of 1 μm across the ground plane 112 and signal line 111. However, analogous to the conducting layer 130, different thicknesses of the nanopore layer 140 can be implemented. Moreover, as depicted in FIG. 2B and FIG. 2C, the nanolayer 140 may reside on the ground plane 112 only or the signal line 111 only, depending on the implementation.

NWs are formed by depositing an electrically conducting material, such as a suitable metal (e.g., Cu or Ni), in the nanopores of the nanopore layer 140. The material forming the NWs can be the same electrically conducting material as that used for the conducting layer 130. In some embodiments, copper can be used for the NWs and/or the layer of conducting material 130 composing the ground plane 112 and signal line 111.

In some implementations, the NWs penetrate through the nanopore layer 140 to provide an electrical pathway to the layer of conducting material 130. Moreover, NWs can provide vias electrically connecting the layer of conducting material 130 of the ground plane 112 and/or signal line 111 to another circuit component. For example, a second layer of conducting material 150 can be deposited on the nanopore layer 140, which is electrically connected to the first layer 130 by NW vias.

Figure 2D:
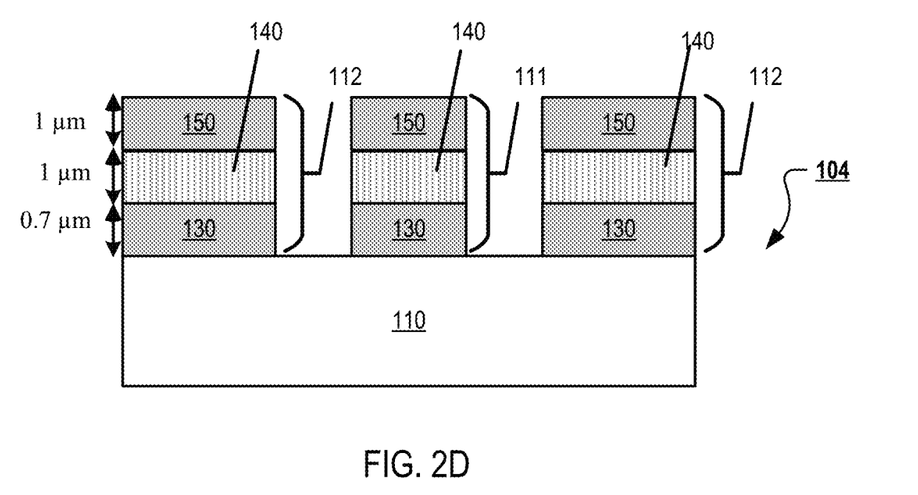

An example NW CPW 104 implementing a second conducting layer 150 (e.g., a capping layer) is depicted in FIG. 2D.

The porosity of the nanopore layer 140 can be in a range from about 8% to about 30%. Typically, the porosity varies by about 1% within a single sample. The size of the nanopores can also vary as desired. In some embodiments, the nanopores have a lateral dimension (i.e., in the plane of the nanopore layer 140) in a range from 5 nm up to 250 nm. Nanopore lateral dimensions may vary about 10% in any one sample. For example, individual samples can include nanopores with a lateral dimension that varies from 9-11 nm or 45-55 nm. In some embodiments, the nanopore layer 140 includes areas in which the nanopores do not include NWs. For example, patterned deposition can be used to selectively form NWs in certain regions of the nanopore layer 140.

In general, the thickness of different components disposed on the substrate 110 can vary as appropriate and can, in certain embodiments, be relatively thin. For example, the nanopore layer 140 can be about 2 μm or less (e.g., 1.5 μm or less, 1.2 μm or less, 1.0 μm or less, 0.9 μm or less, 0.8 μm or less, or as thin as 0.5 μm). The thickness of the electrically conducting layer 140 can be the same, or the two layers can have different thickness. In some embodiments, these layers have a thickness in a range from 0.5 μm to about 5 μm (e.g., from 1 μm to 3 μm, such as 1 μm to 2 μm). Likewise, the thickness of the second conducting layer 150 can be different than the conducting layer 130 and nanopore layer 140 thicknesses.

Thicknesses of the layers, porosity of the nanopore layer 140, conducting materials of the layers, etc. are design features that can vary depending on a particular application. Moreover, as illustrated in FIGS. 2A-2E, the layers can be deposited to form the ground plane 112 and signal line 111 in various different ways.

Forming the NW CPW 101 generally involves anodizing a layer of aluminum to form the nanoporous AAO layer 140 over a copper layer and then depositing a metal (or other electrically conducting material) over the AAO layer to provide NWs within the pores of the AAO layer.

After forming the pores, the NW material (e.g., Cu) is deposited into the pores to form the NWs. While Cu is mentioned as an example, more generally any suitable electrically conducting material can be used, including other metals such as nickel. Any method appropriate for depositing the material into the pores under conditions in which the AAO layer is maintained can be used. For example, electrodeposition can be used to deposit, e.g., metals into the pores.

After formation of the NWs, the top surface can be polished (e.g., using chemical mechanical polishing) to provide a flat surface for further processing steps (e.g., deposition of another electrically conducting layer or other materials).

Figure 3:
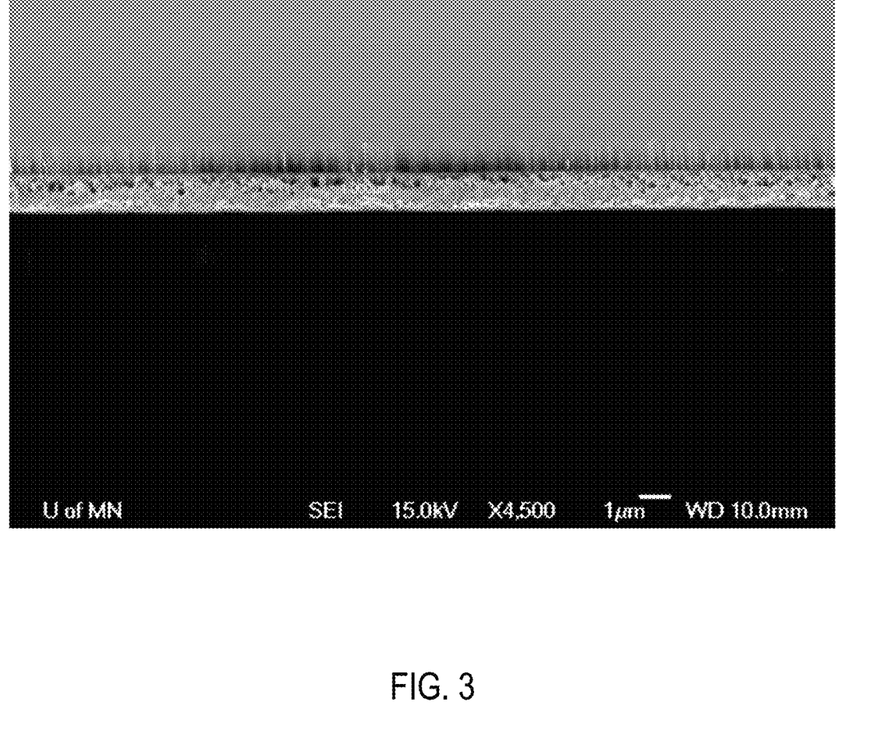
FIG. 3 is a Scanning Electron Micrograph (SEM) of an example article with nanowires formed in an AAO layer on a silicon substrate.

An example of an AAO nanoporous layer with NWs formed using this method is shown in cross-section in FIG. 3. In this example, a 1 μm thick layer of AAO is integrated on a Si substrate using a titanium-tungsten (TiW) adhesion layer with electrodeposited Cu NWs. The AAO layer is the top layer and the NWs are visible as white rods through AAO due to 15 kV acceleration voltage.

FIGS. 2B-2D depict cross-sections of other example implementations of NW CPWs. FIG. 2B includes a ground-only NW CPW 102 that supports the nanopore layer 140 over the conducting layer 130 of the ground plane 112. Conversely, FIG. 2C includes a signal-only NW CPW 102 that supports the nanopore layer 140 over the conducting layer 130 of the signal line 111. In these cases, the layer of conducting material 130 and nanopore layer 140 have uniform thicknesses of 1 μm but as mentioned previously, thicknesses can vary depending on the particular application.

FIG. 2D shows another implementation of a NW CPW 104 featuring a second conducting layer 150 deposited over the nanopore layer 140. In this case, both the ground plane 112 and signal line 111 support the nanopore layer 140 and second conducting layer 150. However, similar to NW CPWs 101-103, the second conducting layer 150 can be deposited strictly on the ground plane 112 or signal line 111 depending on the implementation. Hence, numerous combinations of the nanopore layer 140 and second conducting layer 150 can be envisioned. For example, in some implementations, the ground plane 112 and signal line 111 both support the nanopore layer 140 but only the signal line 111 supports the second conducting layer 150.

Methods of fabricating and characterizing loss performance of the example NW CPWs 101-104 will be described below.

Figure 2E:
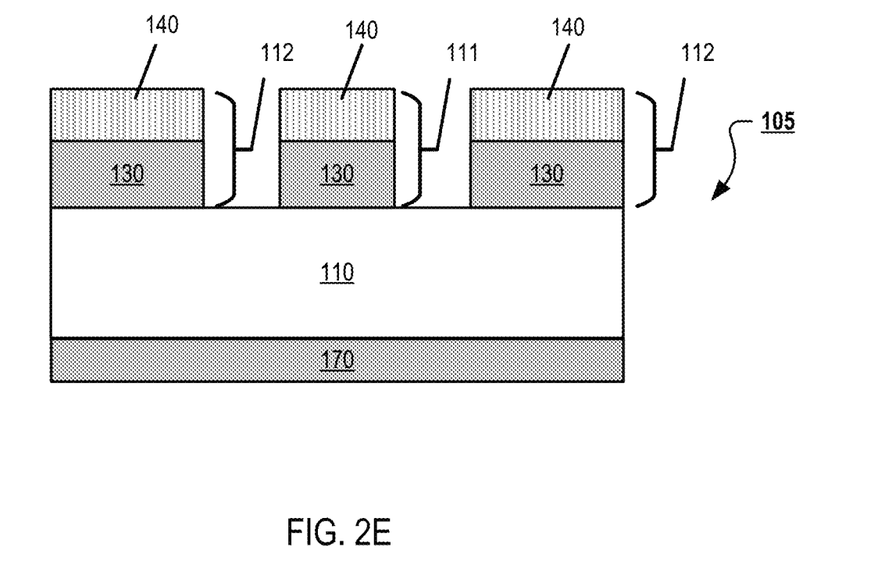
FIG. 2E is a cross-sectional view of an example conductor-backed nanowire CPW.
Figure 2F:
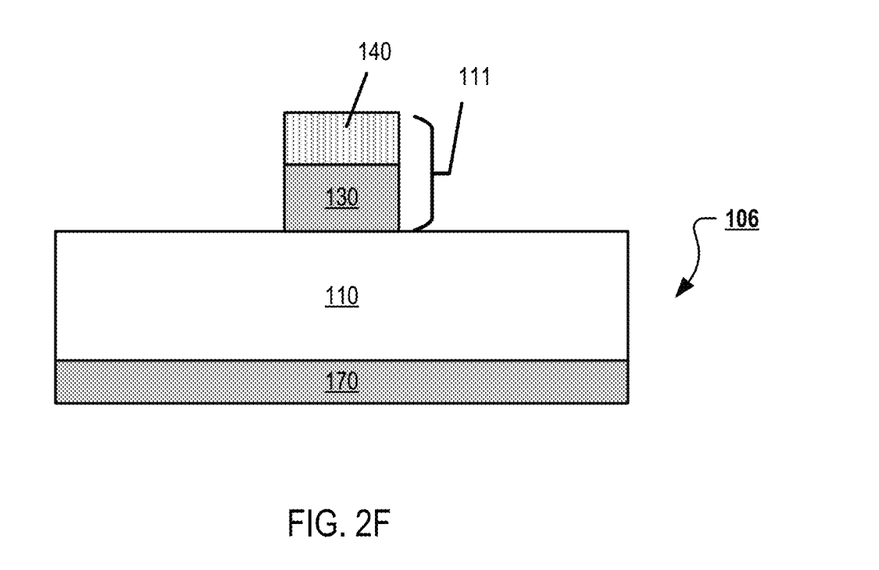
FIG. 2F is a cross-sectional view of an example nanowire microstrip transmission line.

Further implementations of NW interconnects are illustrated in FIG. 2E and FIG. 2F. For example, FIG. 2E shows a cross-section of a conductor-backed NW CPW 105 where a second ground plane 170 serves as a second reference potential. FIG. 2F depicts a cross-section of an example NW microstrip transmission line 106 with a nanopore layer 140 deposited on top the conducting layer 130 of the signal line 111. Here, the second ground plane 170 serves as the reference potential. In either case, incorporating nanopore layers 140 composed of NWs can increase loss performance of the waveguides while simultaneously requiring less conducting material compared to standard waveguides.

In general, NW waveguides can be incorporated as interconnects into a variety of more elaborate IC structures, including complementary metal-oxide-semiconductor (CMOS) devices. CMOS technology is used for constructing integrated circuit (IC) chips, including microprocessors, microcontrollers, memory chips (including CMOS BIOS), and other digital logic circuits. CMOS technology is also used for analog circuits such as image sensors (CMOS sensors), data converters, RF circuits (RF CMOS), and highly integrated transceivers for many types of communication. Accordingly, NW waveguides can be incorporated into any of the aforementioned CMOS devices. In some embodiments, NW waveguides are incorporated into a millimeter or sub-millimeter wave communication system using CMOS technology.

Figure 4A:
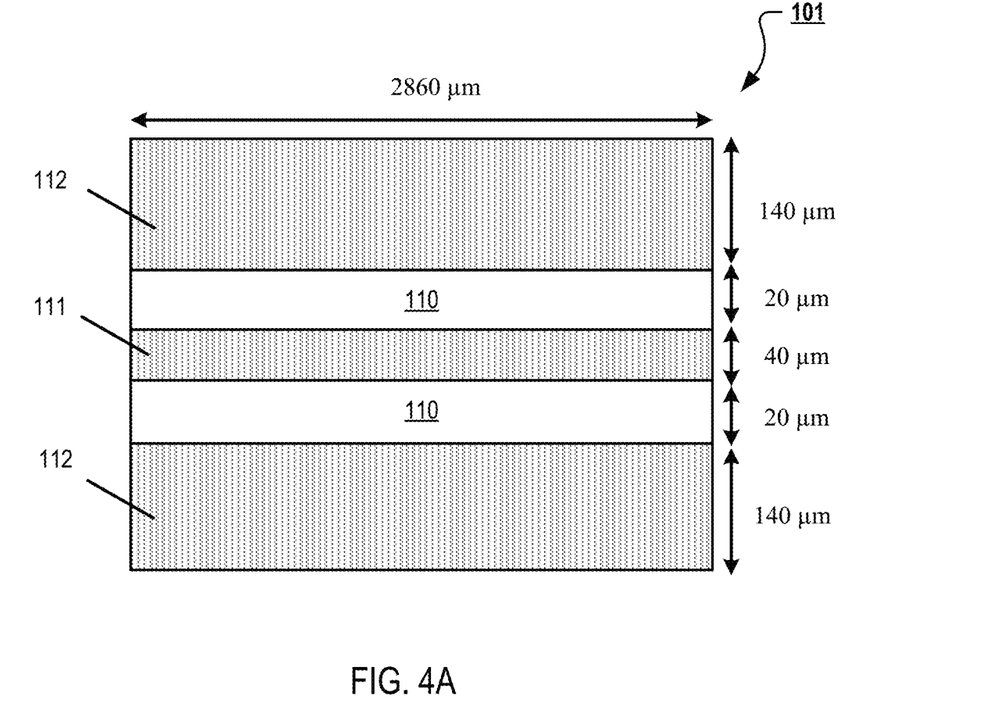
FIG. 4A is a top view showing dimensions of a narrow profile nanowire CPW used in a one-unit CPW circuit.
Figure 4B:
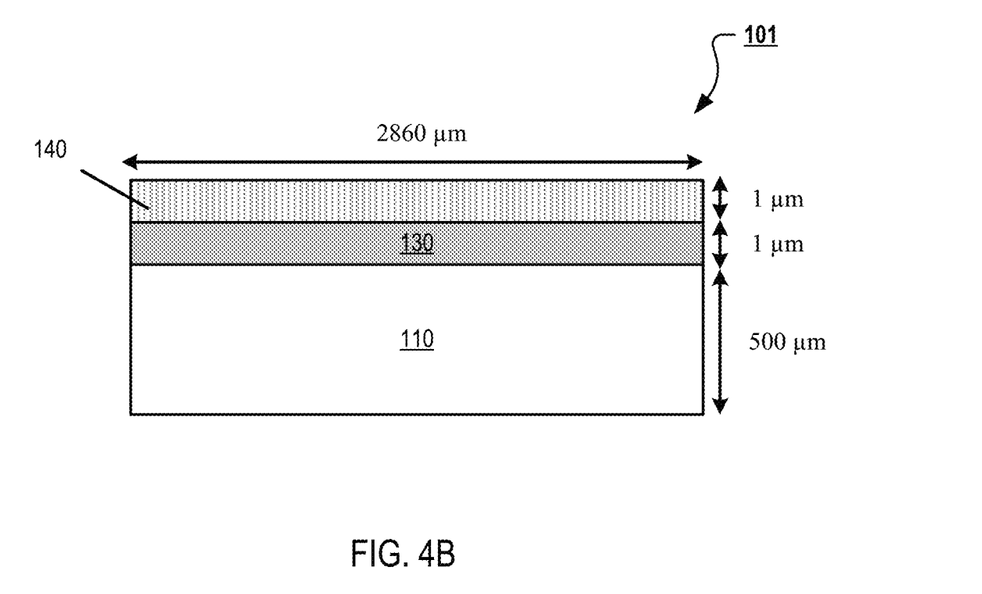
FIG. 4B is a side view of a ground plane of the nanowire CPW shown in FIG. 4A.
Figure 4C:
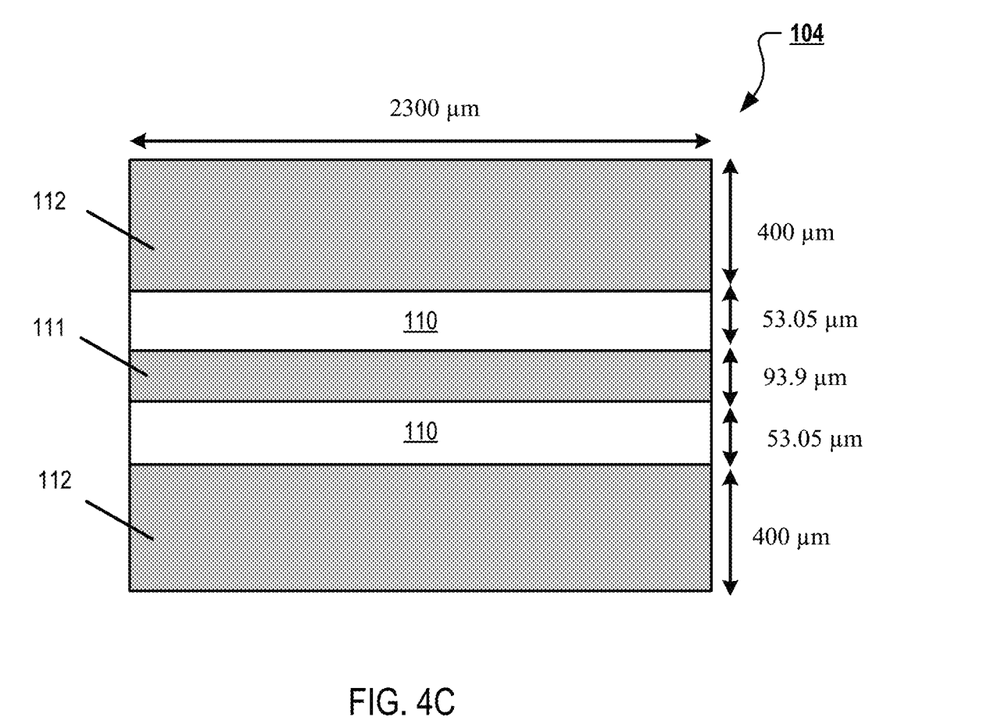
FIG. 4C is a top view showing dimensions of a wide profile nanowire CPW used in a one-unit CPW circuit.
Figure 4D:
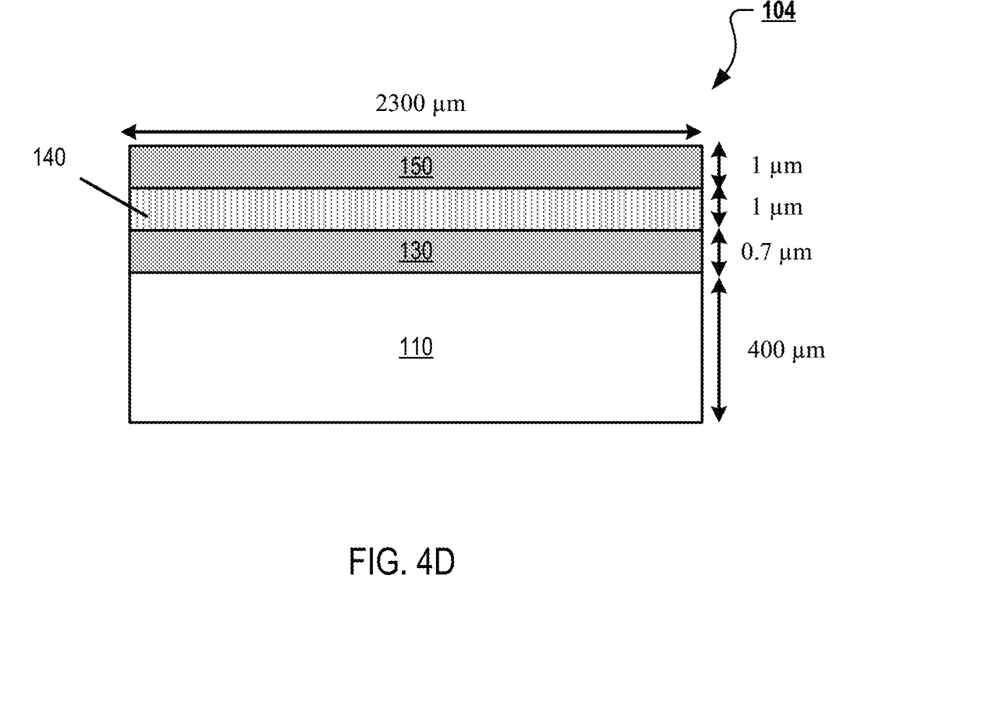
FIG. 4D is a side view of a ground plane of the nanowire CPW shown in FIG. 4C.

FIG. 4A is a top view of an example NW CPW 101 design with dimensions of components included. FIG. 4B is a side view of the same NW CPW 101 design depicted in FIG. 4A. In this case, the NW CPW 101 has a narrow profile and is designed to optimally operate at very high frequencies, e.g., microwave and millimeter wave frequencies. However, NW CPWs can also be designed for low frequency operation, for example by using a wider profile device, which outperform standard CPWs in the same frequency range. FIG. 4C and FIG. 4D show an example of a wide profile NW CPW 104 design with dimensions of components included.

In the high frequency (narrow profile) implementation, the NW CPW 101 has a total length of 2860 µm and total width of 360 µm. Specifically, the ground plane 112 on either side of the signal line 111 has a width of 140 µm, while the signal line 111 has a width of 40 µm. Slots electrically isolating the ground plane 112 from the signal line 111 have widths of 20 µm. In this case, the NW CPW 101 is supported on a 500 µm thick substrate. However, as mentioned previously, substrate thickness, conducting layer thicknesses, interconnect dimensions, etc. can vary depending on the desired application and performance requirements. Hence, the dimensions disclosed in the drawings should not be considered limitations of the devices.

Figure 5A:
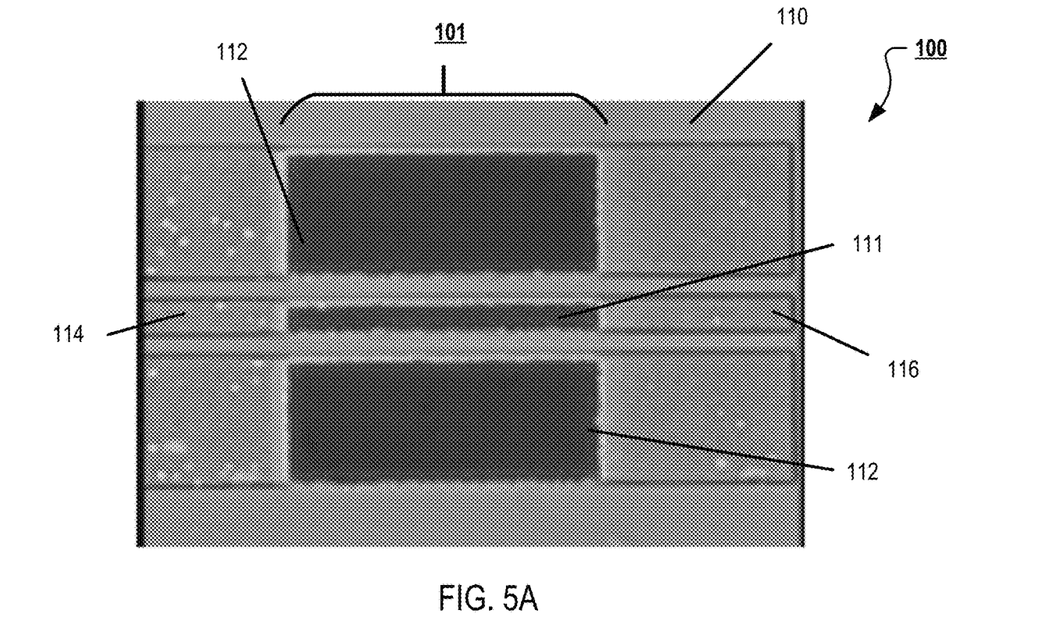
FIG. 5A is a top view of an image of a fabricated one-unit CPW circuit including a nanowire CPW.

FIG. 5A is an image showing a fabricated one-unit CPW circuit 100 that includes an example NW CPW 101. Dimensions of the fabricated circuit 100 correspond to the dimensions included in FIG. 1, FIG. 2A, FIG. 4A and FIG. 4B. In this case, all conducting materials of the circuit 100 are copper and the nanopore layer 140 is composed of AAO with copper NWs. The substrate 110 is a high resistivity Si wafer.

Figure 5B:
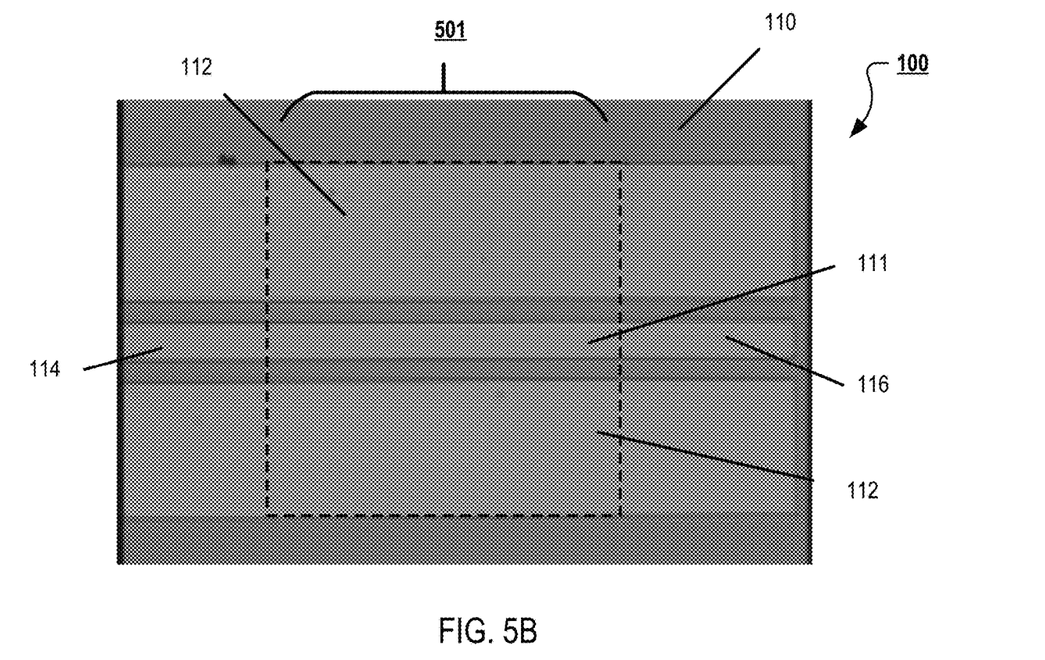
FIG. 5B is a top view of an image of a fabricated one-unit CPW circuit including a standard CPW.

FIG. 5B is an image showing a fabricated one-unit CPW circuit 100 that includes a standard CPW 501. Here, dimensions are identical to those in FIG. 5A except the standard CPW has no nanopore layer 140. The copper conducting layer 130 composing the ground plane 112 and signal line 111 is 1 µm thick.

Although not depicted in the drawings, fabricated one-unit NW CPW circuits that include NW CPWs 102 and 103 are designed with the same feature dimensions as NW CPW 101, besides the varying nanolayer 140 depositions as depicted in FIG. 2B and FIG. 2C. All three NW CPWs 101-103 are characterized by their insertion loss performance in FIG. 7A and compared with the standard CPW 501. The NW CPWs 101-103 and standard CPW 501 optimally operate in a high-frequency range of 50 GHz to 180 GHz and have a single mode operation up to 167 GHz. Nevertheless, NW CPWs can be tuned to higher frequencies as well.

A fabrication process for the one-unit NW CPW circuit shown in FIG. 5A is as follows. Integrated AAO is formed on a surface of a Cu layer that is supported by a Si wafer substrate. The AAO is formed using a method described by J. Um, M. R. Z. Kouhpanji, S. Liu, Z. N. Porshokouh, S.-Y. Sung, J. Kosel and B. Stadler in "Fabrication of Long-Range Ordered Aluminum Oxide and Fe/Au Multilayered Nanowires for 3-D Magnetic Memory," in *IEEE Transactions on Magnetics*, vol. 56, No. 2, pp. 1-6, February 2020, Art No. 6701006. Specifically, the method is implemented to convert deposited aluminum to porous AAO. A pore-widening process is then used to open pores of the AAO to a desired diameter. Then, Cu nanowires are electrodeposited to a desired height. CPW circuits are formed by etching slots of the NW CPW and around circuit components on the wafer. The silicon wafer is high resistivity (e.g., >5000 Ω·cm) with a dielectric permittivity of 11.7 and thickness of 500 µm.

The fabrication process produces an AAO nanopore layer 140 with a thickness of 1.03 µm+/−0.01 µm. The nanopore layer 140 has a porosity of 12% which makes the Cu NWs 12% by volume of the nanopore layer 140. The NWs have a diameter of 23.9 nm+/−0.9 nm.

NW fabrication techniques are also described in U.S. application Ser. No. 17/339,267, filed on Jun. 4, 2021, and entitled "NANOWIRE-BASED INTEGRATED VIA IN ANODIC ALUMINUM OXIDE LAYER FOR CMOS APPLICATIONS," the entire contents of which are incorporated herein by reference.

Figure 6:
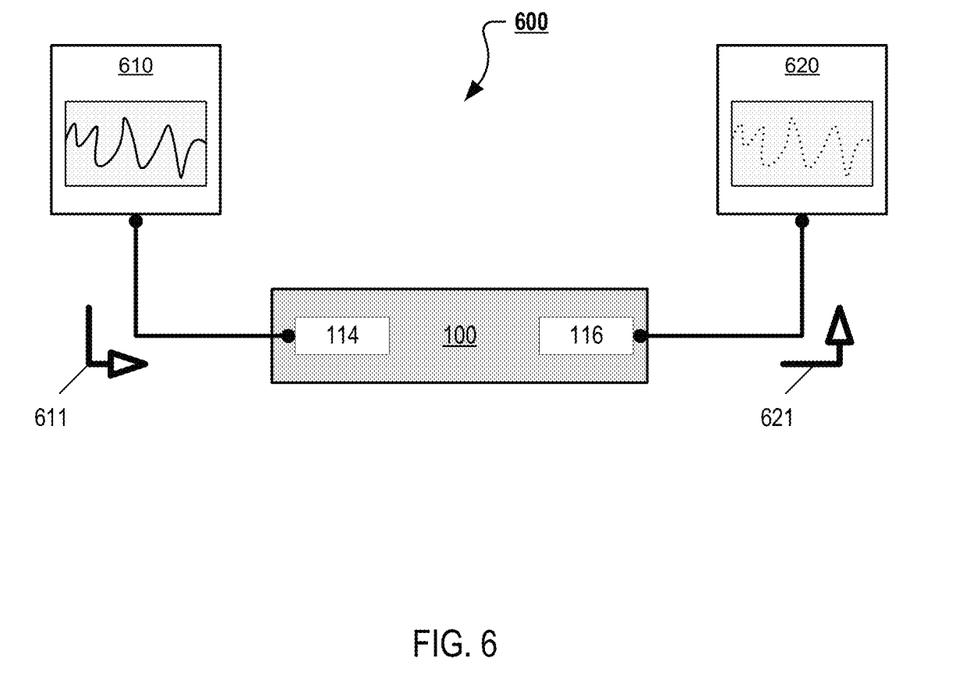
FIG. 6 is a schematic diagram of a testing method for measuring CPW performance in a one-unit CPW circuit.

FIG. 6 is a schematic diagram of a testing method 600 for measuring CPW performance in a one-unit CPW circuit 100. A probe of a transmitter electronic control module (ECM) 610 is contacted with the circuit 100 at an input port 114. A second probe of a receiver ECM 612 is contacted with the circuit 100 at an output port 116. Note, in many cases, the ECMs 610 and 612 are the same device, such as a vector network analyzer (VNA), which can use feedback to characterize the circuit 100.

The transmitter ECM 610 generates an input signal 611 which enters the circuit 100 at the input port 114. As the ports 114 and 116 are electrically connected to a CPW (not shown in FIG. 6), the input signal 611 is transmitted through the circuit 100 by the CPW and exits at the output port 116. An output signal 621 is processed by the receiver ECM 620 which can be compared with the input signal 621 to characterize various performance metrics of the circuit 100.

The ECMs 610 and 620 can measure a voltage, current, power, etc. of the signals 611 and 621 to determine how much signal was lost, reflected, delayed, etc. after interacting with the circuit 100. For example, scattering parameters (S-parameters) are commonly used to describe the performance of microwave circuits. They may be determined as the voltage ratio between output port 114 and input port 116. For example, $S_{21}$ can be determined as output voltage of the output signal 621 divided by input voltage of the input signal 611. Put another way, $S_{11}$ is a reflection coefficient and describes how much of the input signal 611 is reflected signal. $S_{21}$ is an insertion loss and describes how much of the input signal 611 is transmitted to the output port 621. Generally, the insertion loss (IL) is represented in dB units as, $$IL = 20 \log_{10}|S_{21}| dB.$$

S-parameters are complex numbers as they characterize both magnitude and phase of the signals 611 and 621. Hence, a magnitude of $S_{21}$ is used in the insertion loss to determine a total effective loss. The more negative the IL (in dB units), the less input signal 611 is transmitted to the output port 621. For example, an insertion loss of −20 dB corresponds to an output voltage with 10% magnitude of an input voltage.

The insertion loss describes the total loss across an entire length of CPW. A loss per unit length can also be determined from the insertion loss which describes the loss of an increment of the CPW. This metric can be valuable when using CPWs as interconnects in IC applications as the effective insertion loss can be approximated from the loss per unit length multiplied by a total length of interconnects. For example, the loss per unit length of CPWs with dimensions described in FIG. 4A and FIG. 4B can be found from the negative of the IL divided by 2860 µm.

Although the method 600 is described by two separate ECMs 610 and 612, in some implementations, the probes are connected to the same ECM such that a single ECM acts as transmitter and receiver, such as the VNA mentioned previously. Moreover, signals can generally be transmitted in either direction of the circuit 100. Measuring input and output signals 611 and 621 transmitting in different directions can be used to find all the S-parameters of the CPW circuit 100.

FIG. 7A is a plot showing insertion loss performance of example narrow profile NW CPWs 101-103 compared to a standard narrow profile CPW 501 across a frequency range of MHz to 180 GHz. Dimensions of the CPWs are identical to those described in FIG. 4A and FIG. 4B except for variations in nanopore layer 140 deposition. Accordingly, the NW CPWs 101-103 have 1 µm thick conducting/nanopore layers 130/140, where the nanopore layer 140 has 12% porosity of NWs. The standard CPW 501 has a 1 µm thick conducting layer 130 (and no nanopore layer 140).

One-unit CPW circuits are measured from 10 MHz to 110 GHz frequencies using an E8361C Keysight vector network analyzer and a Keysight N5242A (75 GHz-110 GHz) frequency extender. Circuits are tested on a Cascade M150 probe station with Infinity I110A G-S-G probes with pitch of 100 µm. Line-reflect-match (LRM) calibration is used with an ISS101-190 calibration substrate.

One-unit CPW circuits are measured from 140 GHz to 180 GHz frequencies using the E8361C Keysight vector network analyzer and an OML N05VNA2-T/R (140 GHz-220 GHz) frequency extender. Circuits are tested on the Cascade M150 probe station with vendor Infinity I220T G-S-G probes with a pitch of 50 µm. LRM calibration is used with a 138-356 calibration substrate.

One-unit CPW circuits are not measured between 110 GHz to 140 GHz due to unavailability of appropriate equipment.

As can be seen in FIG. 7A, from about 50 GHz to 180 GHz, the NW CPWs 101-103 have a consistently lower insertion loss than the standard CPW 501. In this frequency range, the NW CPWs 101-103 have, on average, insertion loss improvements of about 0.2 dB, with up to 0.25 dB improvements near 180 GHz. In comparison, a narrow profile CPW with a 3 µm thick conducting layer 130 (and no nanopore layer 140) realizes a modest 0.1 dB improvement over the 1 µm standard CPW 501 within the same frequency range. Since the NW CPWs 101-103 implement low porosity (12%) AAO in the nanopore layer 140, a fraction of copper is required to achieve superior performance in a high-frequency band when compared to the 3 µm CPW.

FIG. 7B shows a comparison between the loss per unit length of NW CPW 101 and the standard CPW 501. As expected, the NW CPW 101 sees improved performance over the standard CPW 501.

Figure 7C:
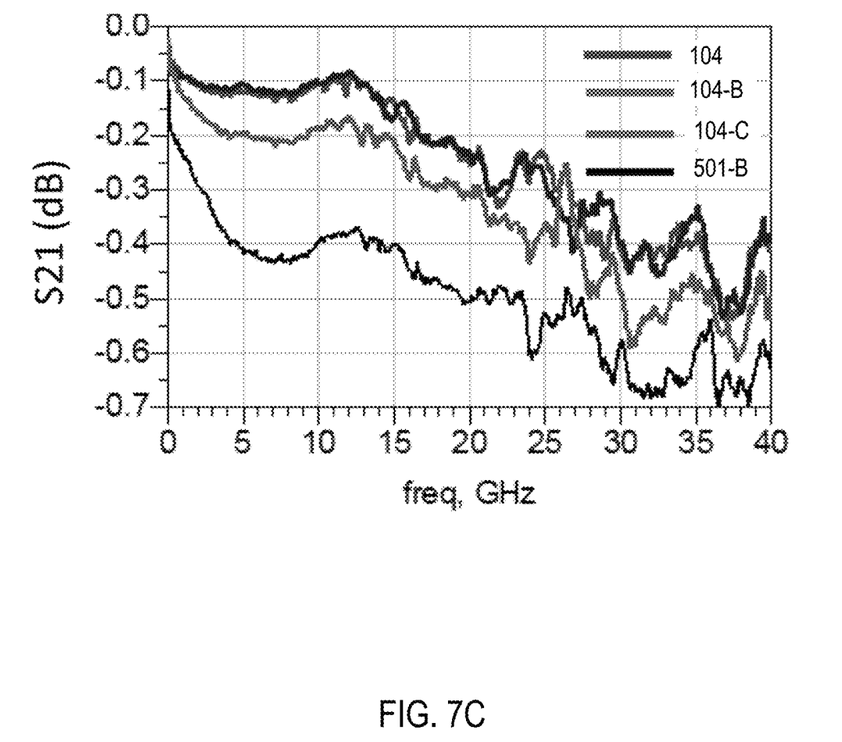
FIG. 7C is a plot showing insertion loss performance of example wide profile nanowire CPWs compared to a standard wide profile CPW across a frequency range of 10 MHz to 40 GHz.

FIG. 7C is a plot showing insertion loss performance of example wide profile NW CPWs 104, 104-B and 104-C compared to a standard wide profile CPW 501-B across a frequency range of 10 MHz to 40 GHz. Dimensions of the CPWs are identical to those described in FIG. 4C and FIG. 4D except for variations in nanopore layer 140 and second conducting layer 150 deposition.

Accordingly, the NW CPWs 104, 104-B and 104-C have a 0.7 µm thick first conducting 130, a 1 µm thick nanopore layers 140 and a 1 µm thick second conducting 150, where the nanopore layer 140 has 12% porosity of NWs. However, for NW CPW 104-B, only the ground plane 111 supports the nanopore layer 140 and second conducting layer 150. Similarly, for NW CPW 104-C, only the signal line 112 supports the nanopore layer 140 and second conducting layer 150.

The standard CPW 501-B has a 1 µm thick first conducting layer 130 (and no nanopore layer 140 or second conducting layer 150).

As can be seen in FIG. 7C, across the entire frequency range of 10 MHz to 40 GHz, the NW CPWs 104, 104-B and 104-C have a consistently lower insertion loss than the standard CPW 501-B. In this frequency range, the NW CPWs 104, 104-B and 104-C have average insertion loss improvements of about 0.15 dB, with up to 0.25 dB improvements around 5 GHz to 10 GHz. In comparison, a wide profile CPW with a 2.7 µm thick conducting layer 130 (and no nanopore layer 140 or second conducting layer 150) realizes roughly the same performance within the same frequency range. However, since the NW CPWs 104, 104-B and 104-C implement low porosity (12%) AAO in the nanopore layer 140, significantly less copper is required.

Of course, the dimensions of the NWs, CPWs, conducting/nanopore layers and other portions of the structures described in FIGS. 2A-2D that are characterized by the experimental data presented in FIGS. 7A-7C are merely examples and, generally, dimensions for similar structures in other embodiments can be determined (e.g., empirically or by calculation) based on the specific application in mind.

A number of examples have been described. Nevertheless, it will be understood that various modifications may be made without departing from the spirit and scope of the invention. For example, while the foregoing techniques involves forming NW CPW interconnects on a Si substrate, the techniques can be applied to forming NW CPWs on other substrates, such as on glass (e.g., borosilicate glass) and polymer (e.g., polyimide) substrates. Accordingly, other embodiments are within the scope of the following claims.

What is claimed is:

1. A device, comprising:
   a substrate; and
   at least one electrically conducting portion supported by the substrate, the at least one electrically conducting portion comprising a signal line extending from a first port to a second port, and a ground plane electrically isolated from the signal line,
   wherein the electrically conducting portion comprises a layer of a first electrically conducting material and a layer of a metal oxide material comprising anodic aluminum oxide (AAO) and one or more nanowires (NW) of a second electrically conducting material each formed within a corresponding pore extending through the AAO from a first side of the layer to a second side of the layer of the metal oxide material opposite the first side,
   wherein the signal line comprises a layer of a third electrically conducting material, wherein the layer of the metal oxide is arranged between the layer of the first electrically conducting material and the layer of the third electrically conducting material, the layer of third electrically conducting material extending continuously between the first port and the second port.

2. The device of claim 1, wherein the signal line comprises the layer of the metal oxide material.

3. The device of claim 1, wherein the ground plane comprises the layer of the metal oxide material.

4. The device of claim 1, wherein both the signal line and the ground plane comprise the layer of the metal oxide material.

5. The device of claim 1, wherein the metal is selected from the group consisting of Cu, Al, Au, and Ag.

6. The device of claim 1, wherein the second electrically conducting material comprises a metal.

7. The device of claim 6, wherein the metal is selected from the group consisting of Cu, Al, Au, and Ag.

8. The device of claim 1, wherein the first and second electrically conducting materials are the same.

9. The device of claim 1, wherein the substrate is a silicon substrate.

10. The device of claim 1, wherein the layer of the first electrically conducting material has a thickness of 5 µm or less.

11. The device of claim 1, wherein the layer of metal oxide material has a thickness of 5 µm or less.

12. The device of claim 1, wherein layer of metal oxide material has a thickness in a range from 0.5 µm to 2 µm.

13. The device of claim 1, wherein the signal line has a width in a range from 1 µm to 200 µm.

14. The device of claim 1, wherein the device is a waveguide having a loss per unit length in a range from 0.3 dB/mm to 0.6 dB/mm for electrical signals spanning a frequency range of 50 GHz to 180 GHz.

15. The device of claim 1, wherein the device is a waveguide having an insertion loss in a range from −1.0 dB to −1.8 dB for electrical signals spanning a frequency range of 50 GHz to 180 GHz.

16. The device of claim 1, wherein the first and third electrically conducting materials comprises a metal.

17. The device of claim 1, wherein the device comprises a coplanar waveguide or a microstrip transmission line.

18. The device of claim 1, wherein the device comprises an integrated circuit.

19. The device of claim 1, wherein the signal line comprises the layer of the metal oxide material and the nanowires are distributed throughout the signal line between the first port and the second port.

20. A method, comprising:
    contacting a probe to opposing ends of a signal line of a device according to claim 1; and
    measuring an insertion loss for the signal line for an electrical signal having a frequency in a range from 140 GHz to 180 GHz.

* * * * *